United States Patent
Maurin, Jr. et al.

(10) Patent No.: US 11,300,632 B2
(45) Date of Patent: Apr. 12, 2022

(54) ADJUSTABLE FREQUENCY DRIVE SYSTEMS AND METHODS OF EMPLOYING POWER COMPENSATION

(71) Applicant: Eaton Intelligent Power Limited, Dublin (IE)

(72) Inventors: John David Maurin, Jr., Arden, NC (US); Stan Rex Simms, Arden, NC (US); Thomas Arthur Farr, Candler, NC (US)

(73) Assignee: Eaton Intelligent Power Limited, Dublin (IE)

(*) Notice: Subject to any disclaimer, the term of this patent is extended or adjusted under 35 U.S.C. 154(b) by 252 days.

(21) Appl. No.: 16/223,865

(22) Filed: Dec. 18, 2018

(65) Prior Publication Data
US 2020/0191878 A1  Jun. 18, 2020

(51) Int. Cl.
  *H02P 23/26* (2016.01)
  *H02P 27/04* (2016.01)
  (Continued)

(52) U.S. Cl.
  CPC ............. *G01R 31/42* (2013.01); *G01R 31/50* (2020.01); *H02J 3/1807* (2013.01); *H02J 9/062* (2013.01);
  (Continued)

(58) Field of Classification Search
  CPC .. H02P 27/047; H02P 21/0089; H02P 23/009; H02P 23/26; H02P 2201/15; H02P 9/44; H02P 23/08; H02P 27/04; H02P 1/30; G01R 31/42; H02J 3/1807; H02J 9/062; H02J 3/1835; Y02E 40/30
  See application file for complete search history.

(56) References Cited

U.S. PATENT DOCUMENTS

| 5,225,712 A | 7/1993 | Erdman |
| 6,295,215 B1* | 9/2001 | Faria ................. H02J 9/062 363/124 |

(Continued)

OTHER PUBLICATIONS

Tom Ernst, Application of Multi-function Motor Protection Relays to Variable Frequency Drive Connected Motors, 2014, IEEE, 271-291 (Year: 2014).*

(Continued)

*Primary Examiner* — Bickey Dhakal
(74) *Attorney, Agent, or Firm* — Stanek Lemon Crouse & Meeks, P.A.

(57) ABSTRACT

An apparatus, such as an adjustable frequency drive (AFD), includes an inverter configured to be selectively coupled to a motor in a first mode and an AC line in a second mode and a control circuit configured to operate the inverter as a motor drive in the first mode and as a power compensator in the second mode. The power compensator may provide power factor correction. The control circuit may include a scalar controller configured to control the inverter according to a voltage vs. frequency characteristic determined by a field weakening point reference and the control circuit may vary the field weakening point reference in the second mode. The inverter may have an input coupled to a DC bus and the control circuit may be configured to adjust a frequency of the inverter in the second mode to increase a voltage on the DC bus.

18 Claims, 10 Drawing Sheets

(51) Int. Cl.
  *H02P 23/00*  (2016.01)
  *H02J 3/18*  (2006.01)
  *G01R 31/42*  (2006.01)
  *H02J 9/06*  (2006.01)
  *G01R 31/50*  (2020.01)

(52) U.S. Cl.
  CPC ............ *H02P 23/009* (2013.01); *H02P 23/26* (2016.02); *H02P 27/047* (2013.01)

(56) References Cited

U.S. PATENT DOCUMENTS

| | | | |
|---|---|---|---|
| 6,411,067 B1 | 6/2002 | Bjorklund | |
| 6,862,199 B2 | 3/2005 | Escobar et al. | |
| 6,906,933 B2 | 6/2005 | Taimela | |
| 7,948,721 B2* | 5/2011 | Brunner | H02P 29/032 361/23 |
| 7,948,778 B2* | 5/2011 | Pfitzer | G01R 31/40 363/34 |
| 8,014,110 B2* | 9/2011 | Schnetzka | H02P 27/08 361/31 |
| 8,025,437 B2 | 9/2011 | Johnson, Jr. | |
| 8,174,853 B2* | 5/2012 | Kane | H02M 7/003 363/40 |
| 8,803,361 B2* | 8/2014 | Johansen | H02J 9/062 307/64 |
| 9,628,016 B2* | 4/2017 | Lamascus | H02J 3/46 |
| 9,645,194 B2 | 5/2017 | Patel et al. | |
| 9,876,354 B2* | 1/2018 | Compton | H02J 9/062 |
| 2004/0252423 A1* | 12/2004 | Boren | H02H 7/0833 361/23 |
| 2005/0286274 A1 | 12/2005 | Pfitzer et al. | |
| 2012/0280645 A1* | 11/2012 | Olsson | H02P 27/047 318/802 |
| 2013/0235494 A1* | 9/2013 | Holce | H02P 27/047 361/31 |
| 2015/0381081 A1* | 12/2015 | Bhangu | H02P 21/0089 318/400.05 |

OTHER PUBLICATIONS

"Medium Voltage Adjustable Frequency Drive," Eaton Brochure, SC9000 EP Test Facility, 2014, 6 pages.
"Testing large ASDSs," ABB review, 2011, pp. 39-44.
Buzzini et al., "Testing Large ASDS," 2012 Petroleum and Chemical Industry Technical Conference, Paper No. PCIC-2012-48, Sep. 2012, 9 pages.
Cho et al., "Modeling, Analysis and Control of Static VAR Compensator Using Three-Level Inverter," Conference Record of the 1992 IEEE Industry Applications Society Annual Meeting, 1992, vol. 1, pp. 837-843.
Dixon et al., Reactive Power Compensation Technologies, State-of-the-Art Review, Proc. IEEE, vol. 93, No. 12, Dec. 2005, pp. 2144-2164.
Nareshbabu et al., "Modelling and Simulation of STATCOM for Compensation of Reactive Power by Using PI With Fuzzy Logic Controller," International Journal of Research and Engineering & Advanced Technology, vol. 2, Issue 2, Apr.-May 2014, pp. 1-6.
Schauder et al., "Vector analysis and control of advanced static VAR compensators," IEE Proceedings-C, vol. 140, No. 4, Jul. 1993, pp. 299-306.
Sueker, Keith H., "A Static Dynamometer for Load Testing Large Variable Frequency Motor Drives," 1997 IEEE, WB1-9.1 to WB1-9.3.
Sueker, Keith H., "Power Electronics Design: A Practitioner's Guide," Elsevier, Jan. 4, 2011, 216-217.
Tada et al., "Study of Full Load Test Method for Large VSDS Driven by Non-Regenerative VSI," 2017 Petroleum and Chemical Industry Conference Europe (PCIC Europe), May 16-18, 2017, 9 pages.

\* cited by examiner

ADJUSTABLE FREQUENCY DRIVE SYSTEMS AND METHODS OF EMPLOYING POWER COMPENSATION

BACKGROUND

The inventive subject matter relates to motor drive apparatus and methods and, more particularly, to adjustable frequency drives and methods of operating the same.

Direct connection of a motor to an AC line can cause large inrush currents and produce uncontrolled torque that can generate damaging mechanical shock. Accordingly, large motors are often started using an adjustable frequency drive (AFD) (also referred to as a variable frequency drive or variable speed drive). An AFD can provide control by varying the output voltage and frequency such that the motor can be gradually brought up to speed at rated torque.

In a typical motor starting application, an AFD receives power from an AC line (e.g. a utility input) and provides an output to a motor that gradually ramps up in voltage and frequency, thus gradually accelerating the motor. When the output of the AFD has reached the voltage and frequency of the AC source, the AFD synchronizes its output voltage with the AC line voltage and a bypass switch is closed to directly connect the motor to the AC source, After direct connection of the motor to the AC line, the AFD may disconnected from the motor and placed in a standby or idle state. To stop the motor, the AFD is activated, synchronized with the AC line voltage and reconnected to the motor and the bypass switch opened. The AFD then gradually decelerates the motor.

AFDs commonly use a scalar (or "V/Hz") control architecture that provides substantially constant V/Hz relationship as the output speed and frequency are gradually increased, up until a point at which a pulse width modulated AC voltage is limited by the amount of DC bus voltage available from the AFD input rectifier. At this point, referred to as the "field weakening point," the AFD increases the output frequency while maintaining the output voltage at a fixed level, which gradually decreases the output torque. The field weakening point is generally dependent on the nature of the motor being driven, so AFDs may be configurable to set the field weakening point for particular applications. For example, the AFD may use a programmable lookup table that can be configured to store a desired V/f operational characteristic responsive to a field weakening point reference input.

SUMMARY OF THE INVENTION

Some embodiments of the inventive subject matter provide an apparatus including an adjustable frequency drive (AFD) having a first port configured to be coupled to an AC line and a switching circuit configured to selectively couple a second port of the AFD to a motor and the AC line in first and second modes. The AFD is configured to operate as a motor drive in the first mode and as a power compensator in a second mode.

In some embodiments, the switching circuit may include a first switch configured to couple a second port of the AFD to a motor and a second switch configured to couple the second port of the AFD to the AC line. The apparatus may further include a control circuit configured to maintain the first switch in a closed state and the second switch in an open state in the first mode and to maintain the second switch in a closed state in the second mode. In further embodiments, the switching circuit may further include a third switch configured to connect the AC line to the motor to bypass the AFD and the control circuit may be configured to maintain the third switch in an open state when the AFD is operating in the first mode and to maintain the third switch in a closed state when the AFD is operating in the second mode.

In some embodiments, the switching circuit includes a plurality of first switches, respective ones of which are configured to couple the second port of the AFD to respective motors and a second switch configured to couple the second port of the AFD to the AC line. The apparatus may further include a control circuit configured to maintain the plurality of first switches in a closed state and the second switch in an open state when the AFD is operating in the first mode and to maintain the second switch in a closed state when the AFD is operating in the second mode. In still further embodiments, the switching circuit may further include a plurality of third switches, respective ones of which are configured to connect the AC line to respective ones of the motors to bypass the AFD and the control circuit may be configured to maintain at least one the plurality third switches in a closed state when the AFD is operating in the second mode.

In some embodiments, the switching circuit may include a first plurality of switches, respective ones of which are configured to couple the second port of the AFD to respective motors and a second plurality of switches, respective ones of which are configured to connect the AC line to respective ones of the motors to bypass the AFD. The apparatus may further include a control circuit configured to maintain at least one switch of the first plurality of switches in a closed state and at least one of the second plurality of switches in a closed state when the AFD is operating in the second mode.

According to further aspects, the AFD may include a control circuit configured to apply a scalar control in both of the first and second modes. The control circuit may be configured to control a voltage at the second port based on a field weakening point reference and may vary the field weakening point reference in the second mode. The control circuit may be configured to vary the field weakening point reference in the second mode responsive to a power measurement for the AC line.

In some embodiments, the control circuit may be configured to trigger an output limitation response based on a state of the AFD meeting a criterion and to vary the field weakening set point based on the criterion. The AFD may include a DC bus and an inverter coupled between the DC bus and the second port of the AFD, and the control circuit may be configured to maintain a first voltage level on the DC bus in the first mode and to maintain a second voltage level on the DC bus in the second mode. The control circuit may be configured to adjust a frequency of the inverter to generate the second voltage level in the second mode.

Further embodiments of the inventive subject matter provide an apparatus including an inverter configured to be selectively coupled to a motor in a first mode and an AC line in a second mode and a control circuit configured to operate the inverter as a motor drive in the first mode and as a power compensator in the second mode. The power compensator may provide power factor correction. The control circuit may include a scalar controller configured to control the inverter according to a voltage vs. frequency characteristic determined by a field weakening point reference and the control circuit may vary the field weakening point reference in the second mode. The inverter may have an input coupled to a DC bus and the control circuit may be configured to adjust a frequency of the inverter in the second mode to increase a voltage on the DC bus.

According to method embodiments, an AFD is operated as a motor drive in a first mode and as a power compensator in a second mode. Operation as a motor drive may include accelerating a motor to a desired speed, synchronizing an output of the AFD to a voltage on an AC line and connecting the motor to the AC line via a bypass switch that bypasses the AFD. Operating the AFD as a power compensator may include operating the AFD as a power compensator after connecting the motor to the AC line via the bypass switch. Accelerating the motor may include increasing a voltage and frequency applied to the motor according using a scalar controller with a fixed field weakening reference point and operating the AFD as a power compensator may include using the scalar controller with a field weakening reference point that varies responsive to a power measurement.

DETAILED DESCRIPTION

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Some embodiments of the inventive subject matter arise from a realization that an AFD that drives one or motors for transfer to and from line operation may be advantageously used to provide power factor correction and/or other power quality compensation when not being used for accelerating or decelerating the one or more motors. For example, in a synchronous transfer control system, one or many motors may be soft-started by an AFD and then transferred to a utility bus with bypass contactors. The resulting power factor of direct online induction motors can be less than desired and result in utility penalties. If the AFD is not being used to control one of the motors, it can be used to perform power factor correction and/or other power quality compensation. In further embodiments, the compensation may be implement using a relatively simply modification of the scalar (V/f) control architecture that is used when the AFD is operating as a motor drive.

A synchronous/synchronizing transfer control system may include an AFD and a switch arrangement that may be operated to a start motor using the AFD and then transfer the motor to the fixed voltage/frequency/phase-angle utility and bypass the AFD. Likewise a bypassed, directly connected motor can be removed from the utility and operate from the AFD in the opposite transfer mode. In some fluid pumping or pipeline compressor applications, the AFD may only be used in this transfer (soft-start) process and then may remain in an idle state for a significant amount of time (e.g., several months) before being activated again. In some embodiments of the inventive subject matter, such an idle AFD can be used as a power compensator, e.g., a power factor corrector. In further embodiments in which a redundant AFD is employed as a backup to a primary AFD, the backup AFD may be used in a similar fashion. This can provide a superior solution for power factor compensation in comparison to solutions that use, for example, switched capacitor banks.

In some embodiments, the AFD can include a control interface that includes a field weakening point reference input parameter that can be varied responsive to a power measurement (e.g., from a VAR meter) to change the V/Hz ratio implemented by the scalar control of the AFD to thus inject or absorb reactive power. Some embodiments may further use the existing slip compensation control of the AFD to adjust a DC bus voltage of the AFD when it is operating as a power compensator, thus avoiding overmodulation of the AFD's inverter and reducing injection of unwanted switching current harmonics into the utility bus. According to still further aspects, power quality compensation along the lines discussed above may be performed under constraints defined by the AFD's operating limit parameters to reduce the likelihood that the AFD will enter into an operational state that may cause the AFD to shut down or take other unwanted protective actions.

Figure 1:
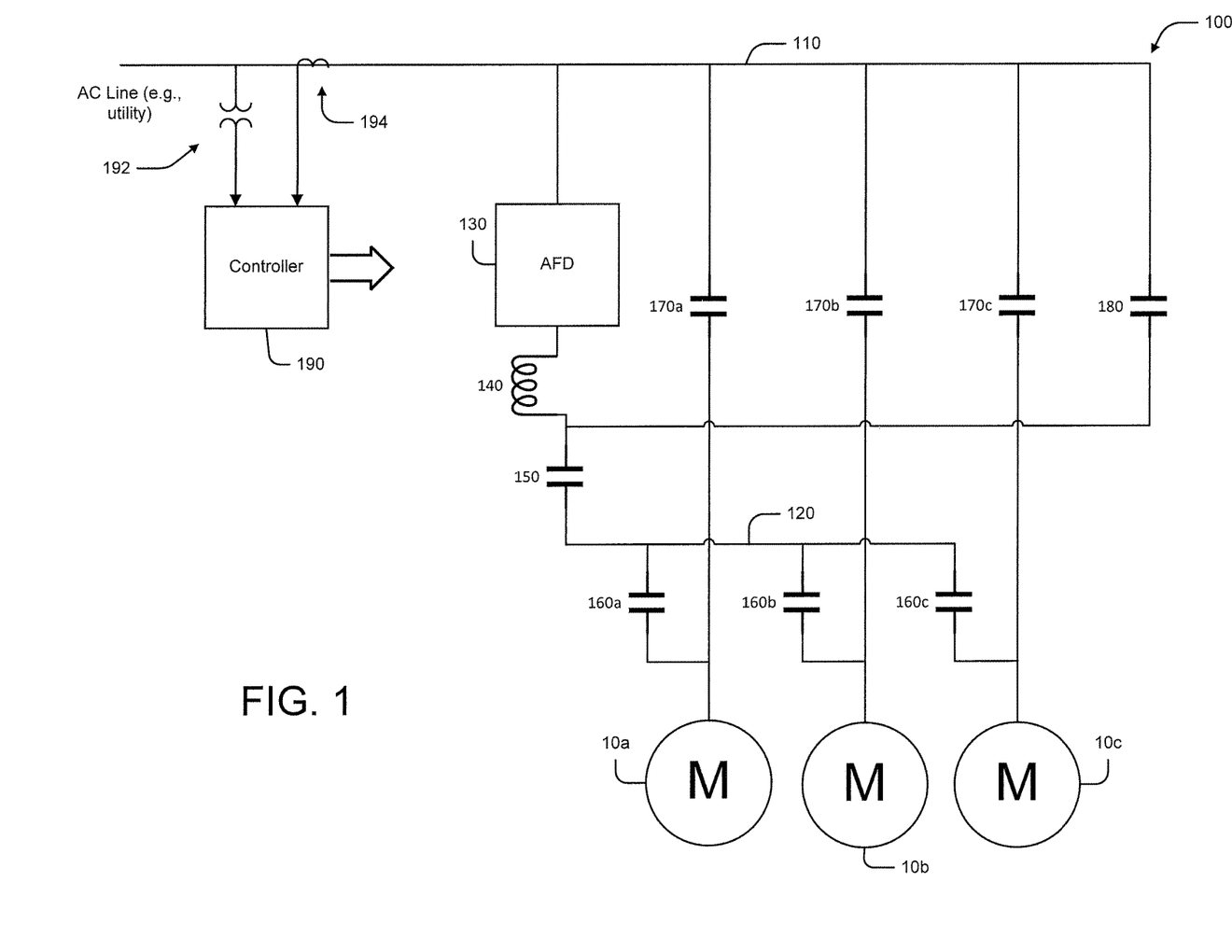
FIG. 1 is a schematic diagram illustrating a motor drive system according to some embodiments.

FIG. 1 illustrates a system 100 according to some embodiments of the inventive subject matter. The system includes an AFD 130, which has an input configured to be coupled to an AC input bus 110 (e.g., a bus connected to a utility feed or other AC line) and an output configured to be coupled to an output bus 120 via an output reactor 140 and a switch, here shown as a contactor 150. First, second and third motors 10a, 10b, 10c are configured to be coupled to the output bus 120 via respective contactors 160a, 160b, 160c. Respective bypass contactors 170a, 170b, 170c are configured to directly connect respective ones of the motors 10a, 10b, 10c to the input bus 110. A supplementary bypass contactor 180 is configured to directly connect the input bus 110 to the reactor 140.

As further illustrated, the AFD 130 and the contactors 150, 160a-160c, 170a-c, 180 are controlled by a control circuit 190. According to some embodiments, the control circuit 190 may be configured to support operation of the AFD 130 as a motor drive to accelerate and/or decelerate the motors 10a, 10b, 10c and to further operate as a power compensator when the bypass contactors 170a-c, 180 are closed and the motors 10a, 10b, 10c are being driven directly by the AC source coupled to the input bus 110. In this mode, for example, the AFD 110 can provide power factor correction and/or other power quality control functions responsive, for example, to voltage and current measurements for the input bus 110 provide, for example, by potential transformer 192 and a current transformer 194, respectively. In some embodiments, the AFD may perform such power control functions using the same scalar (V/Hz or V/f) control architecture that is employed in motor starting/stopping operations.

It will be appreciated that the control circuit 190 may be implemented in a number of different ways. Generally, the control circuit 190 may be implemented using analog circuitry, digital circuitry (e.g., discrete logic and/or integrated circuitry, such as a microprocessor or microcontroller), and combinations thereof. For example, in some embodiments, the AFD 110, 150, 160a-160c, 170a-c, 180 and control circuit 190 may be implemented in a common switchgear unit or multiple switchgear units. In some embodiments, all or portions of the control circuit 190 may be integrated with control circuitry of the AFD 110, such as in common microcontroller and associated circuitry.

Figure 2:
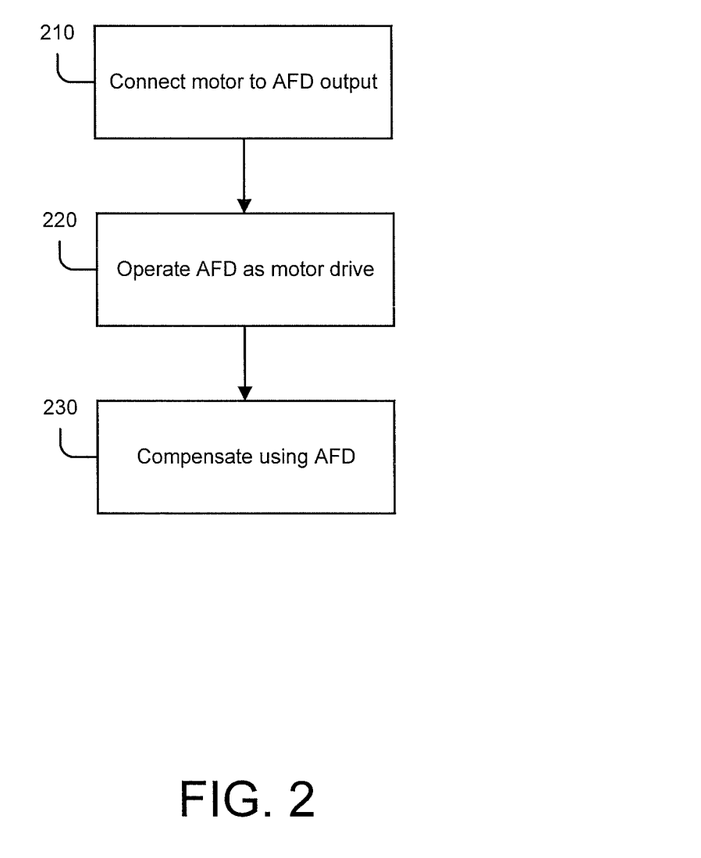
FIG. 2 is a flowchart illustrating operations of the motor drive system of FIG. 1 according to some embodiments.

FIG. 2 illustrates exemplary operations of the system 100 of FIG. 1. A motor is connected to the output of an AFD (block 210). Referring to FIG. 1, for example, one of the motors 10a-c may be connected to the output bus 120 by closing the AFD output contactor 150 and a corresponding one of the motor select contactors 160a-c. Other ones of the motors 10a-c may be inactive or connected directly to the input bus 110 by respective corresponding ones of the bypass contactors 170a-c.

The AFD 130 may then be operated as a motor drive for the connected motor (block 220). For example, the AFD may accelerate the connected motor up to a desired speed and synchronize its output voltage with the line voltage on the input bus, and then one of the associated one of the bypass contactors 170a-c is closed to directly connect the motor to the input bus 110. In some embodiments, the motor may already be operating off the input line via its associated bypass contactor 170a-c, and the connected AFD 110 may be used to decelerate the motor.

When no longer being used as a motor drive, the AFD 130 may be used to for power compensation of the AC line coupled to the input bus 110 (block 230). For example, after the AFD 130 is used to accelerate one of the motors 10a-c and the corresponding bypass contactor 170a-c is closed to connect the motor to the input bus 110, the motor select contactor 160a-c corresponding to the accelerated motor may be opened and the supplementary contactor 180 may be closed. The AFD 130 may then be used, for example, to provide reactive power compensation that corrects a lagging power factor created by the motor(s) coupled to the input bus 110.

It will be appreciated that activation of the AFD 130 to provide such compensation may occur in a number of different ways. For example, in some cases, the motors 10a-c may be brought online in serial fashion, and the AFD 130 may be used for power compensation after this serial activation. In some cases, only selected ones of the motors 10a-c may be activated, after which the AFD 130 may transition to a power compensation mode. In still further cases, the AFD 110 may transition to a power compensation mode after deceleration of one or more of the motors 10a-c, including after all of the motors 10a-c are de-energized.

Figure 3:
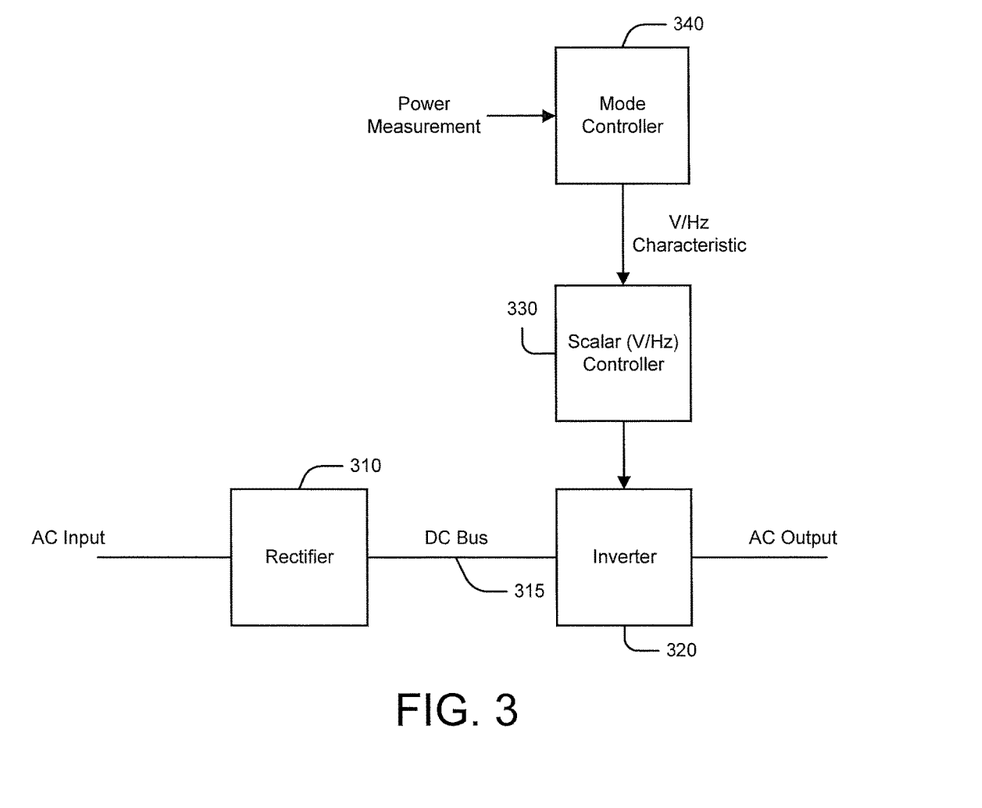
FIG. 3 is a schematic diagram illustrating a system using a scalar controller of an AFD for power factor compensation according to some embodiments.

According to some aspects of the inventive subject matter, a scalar (V/Hz or V/f) control architecture used in an AFD for motor drive operation can also be used to for power compensation operations described with reference to FIGS. 1 and 2. Referring to FIG. 3, an AFD may include a rectifier 310 and an inverter 320 linked by a DC bus 315. The inverter 320 is controlled by a scalar controller 330, which implements a scalar (sometimes referred to as "V/f" or "V/Hz") control architecture that provides a certain V/Hz output characteristic in accelerating a motor. The AFD further includes a mode control circuit 340 that provides information to the scalar controller 330 that defines different V/Hz characteristics for different operational modes of the scalar controller 330. These modes may include a first mode in which the AFD acts as a motor driver and a second mode in which the AFD is used for power compensation, such as power factor correction. In the second mode of operation, the V/Hz characteristic used by the scalar component may be defined responsive to a power measurement (e.g., a measurement of power factor, VARs or the like).

Figure 4:
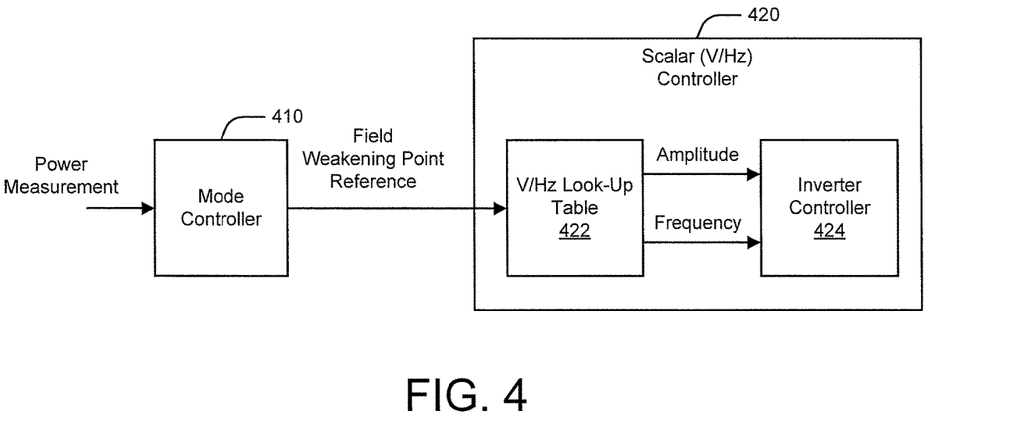
FIG. 4 is a schematic diagram illustrating power factor compensation using variable field weakening point control for an AFD according to some embodiments.

For example, referring to FIG. 4, a scalar controller 420 may include an inverter controller 424 that operates responsive to output voltage amplitude and frequency information generated from a look-up table 422. The V/Hz relationship stored by the look-up table 422 may be defined by a field weakening point reference provided to the scalar controller 420 by a mode controller 410. In a power compensation mode, the mode controller 422 may vary the field weakening point reference responsive to a power measurement (e.g., power factor, VARs or the like). Thus, the mode controller 410 may vary the V/Hz lookup table 422 to provide amplitude and frequency commands to the inverter controller 424 that cause the inverter of the AFD to compensate, for example, for a lagging or leading power factor.

Figure 5:
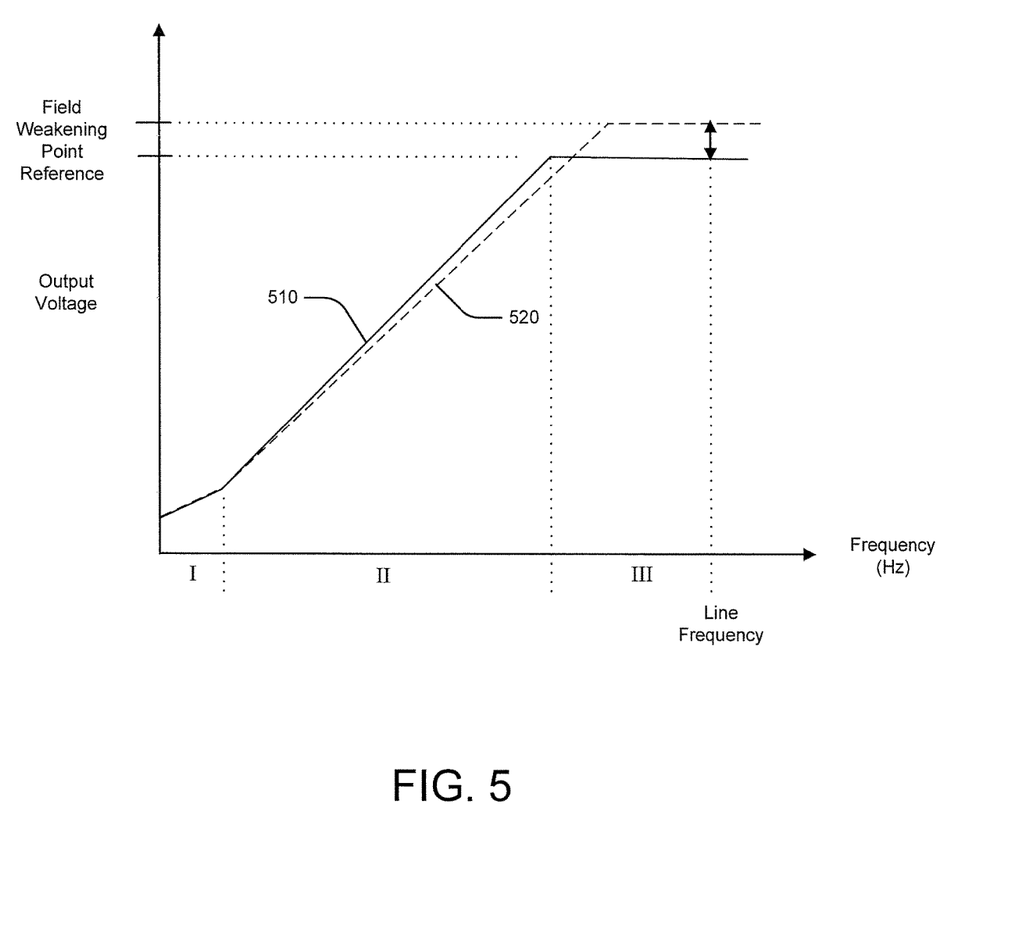
FIG. 5 is a flowchart illustrating operations using variable field weakening point control for an AFD to implement power factor compensation according to further embodiments.

For example, the V/Hz lookup table 422 may implement piecewise linear V/Hz characteristic curves as shown in FIG. 5. Breakpoints and slope of these characteristic curves may be determined, at least in part, based on a field weakening point reference. For example, a first characteristic curve 510 may include an initial startup portion I, a constant V/Hz ramp up portion II, and a field weakening portion III that begins at voltage level corresponding to the field weakening point reference. In a conventional AFD motor drive application, the field weakening reference point would be a fixed value established based on a voltage rating of the motor being driven.

According to some aspects of the inventive subject matter, when operating in a power compensating mode, the field weakening point reference of an AFD may be varied based on a power factor or other power quality measure. This technique can be used to vary the output voltage amplitude provided by the AFD and thereby cause the AFD to source or sink reactive power as needed. For example, as shown in FIG. 5, increasing the field weakening point in such manner would result in the lookup table adopting a modified second characteristic curve 520, wherein the flattening of the output voltage occurs at a higher level. As the AFD operating in the power compensator mode would operate at or near the line frequency (above the field weakening point frequency), this would effectively increase the output voltage magnitude and inject current into the AC line. Similarly, reducing the field weakening point could cause the output voltage to decrease and cause the AFD to sink current from the AC line.

Figure 6:
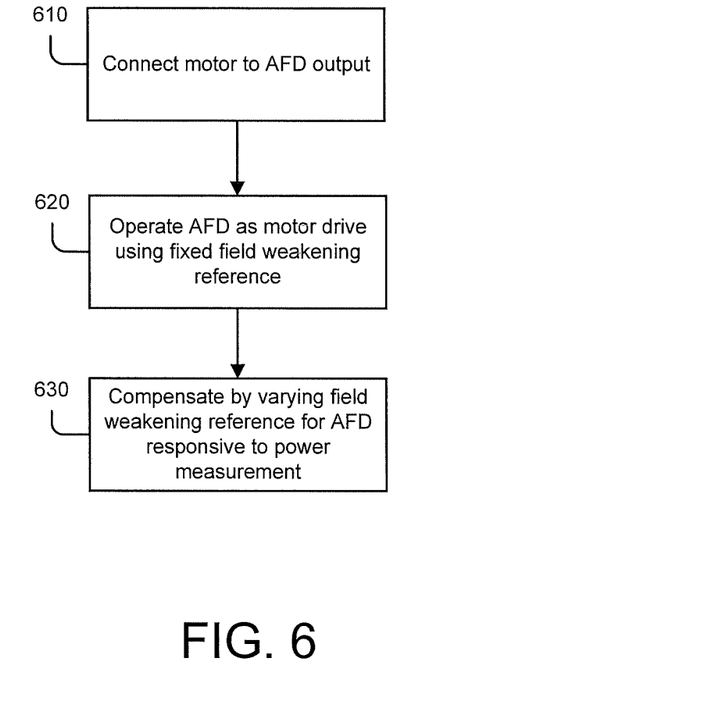
FIG. 6 is a graph illustrating use of variable field weakening point control according to some embodiments.

FIG. 6 illustrates such operations according to further embodiments. A motor is connected to an AFD output and the AFD is operated as a motor drive using a fixed field weakening point reference (blocks 610, 620). After the motor is brought up to speed, synchronized with an AC line and then connected directly to the AC line, the AFD is used to compensate power factor by varying the field weakening reference for the AFD's scalar controller responsive to a power measurement (block 630).

Figure 7:
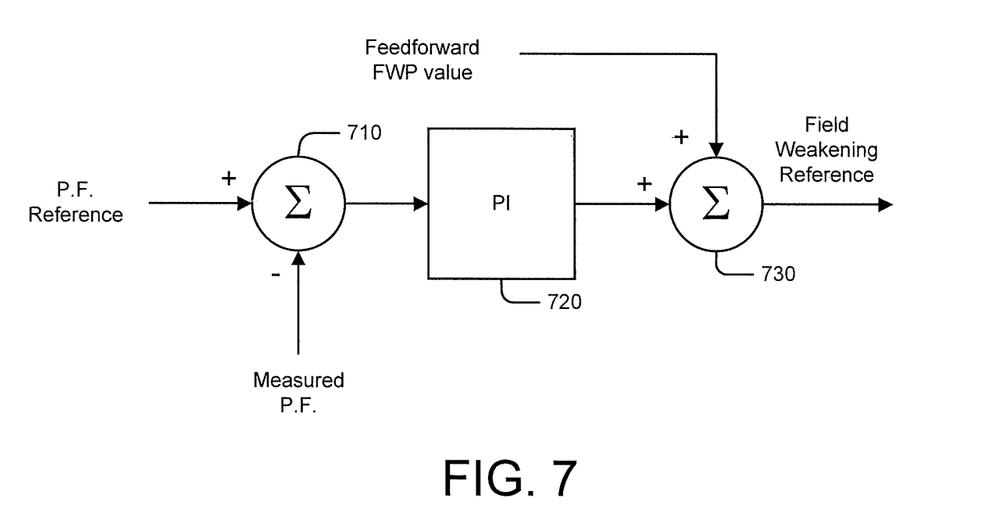
FIG. 7 is a schematic diagram illustrating a control architecture for controlling a field weakening point reference for power factor compensation according to some embodiments.

FIG. 7 illustrates an example of a control architecture that may be used to provide such field weakening point reference control. A power factor reference is compared to a measured power factor at a first summing junction 710. An error signal generated by the comparison is provide to a proportional integrator 720. The proportional integrator 720 produces an output that is offset by a feedforward value corresponding to the nominal motor drive field weakening point at a second summing junction 730 to generate a field weakening reference signal that is provided to a scalar inverter controller, such as the controller 420 described above with reference to FIG. 4.

It will be appreciated that the control architectures described above with reference to FIGS. 3-7 generally may be implemented using analog and/or digital circuitry. For example, such control architectures may be implemented using software executing on a microprocessor, microcontroller or other computing device and/or by analog circuitry providing similar control functionality.

Operating an AFD as a power compensator in the manner described above may result in overmodulation of the AFD's inverter, as the DC voltage maintained on the DC bus of the AFD for motor starting applications may be optimized for driving a motor at output voltage levels up to the line voltage, and not for higher output voltage levels that may be needed for power line compensation. Such overmodulation could result in the generation of unwanted harmonics on the AC line. According to further aspects, such overmodulation may be reduced or prevented by altering (e.g., increasing) the AFD's DC bus voltage when operating in a power compensator mode.

Figure 8:
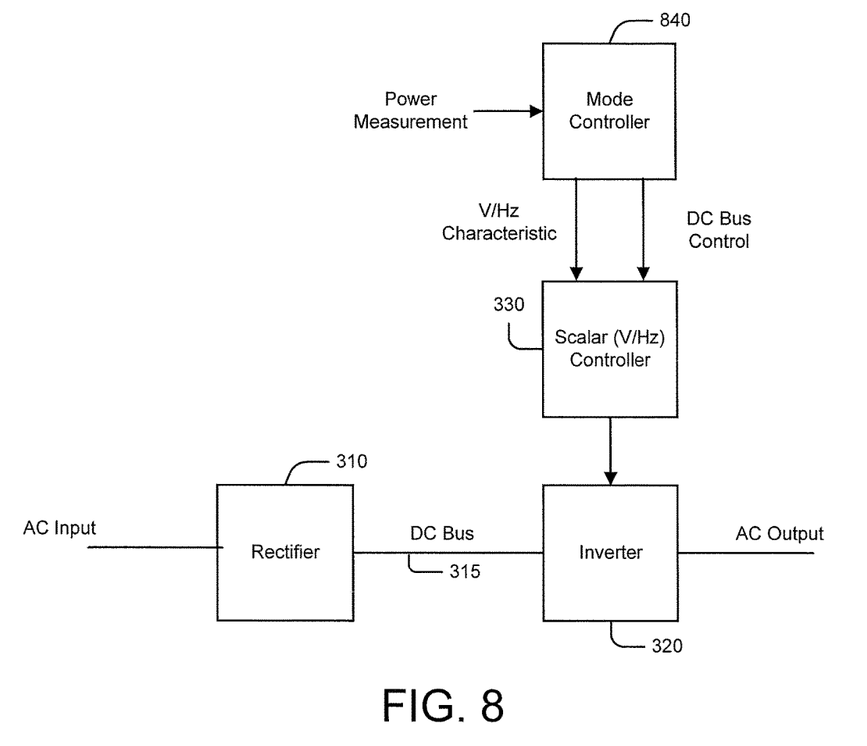
FIG. 8 is a schematic diagram illustrating a system employing a scalar motor drive control and DC bus voltage adjustment for an AFD to provide power factor compensation according to some embodiments.

For example, as shown in FIG. 8, an AFD may include an inverter 320 controlled by a scalar controller 830 that operates responsive to a V/Hz characteristic and a DC bus control signal provided by a mode controller 840. The mode controller 840 may produce the V/Hz characteristic and the DC bus control signal based on whether the AFD is operating as a motor drive or a power compensator such that, for example, the voltage on the DC bus 815 is increased and the V/Hz characteristic is varied responsive to a power measurement.

Figure 9:
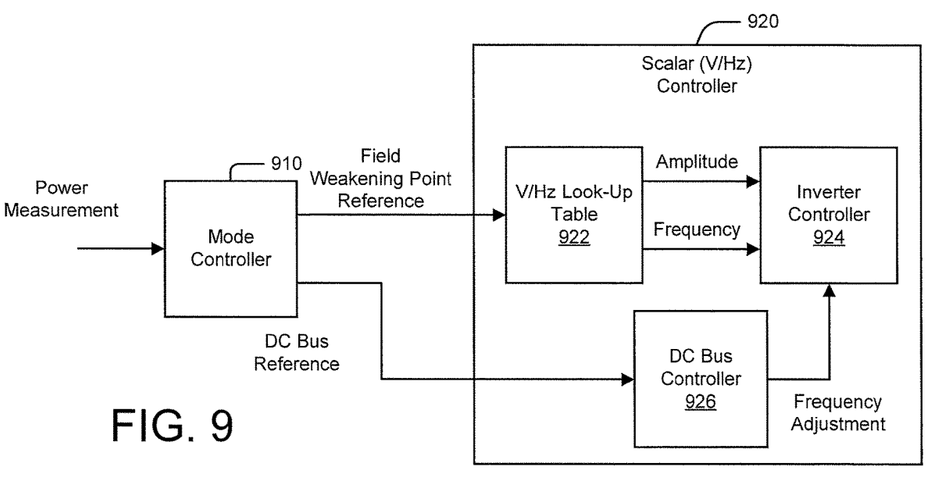
FIG. 9 is a schematic diagram illustrating power factor compensation using variable field weakening point and DC bus voltage control for an AFD according to some embodiments.

In some embodiments illustrated in FIG. 9, a scalar controller 920 may include an inverter controller 924 that operates responsive to output voltage amplitude and frequency information generated from a look-up table 922. The V/Hz relationship stored by the look-up table 922 may be defined by a field weakening point reference provided to the scalar controller 920 by a mode controller 910. Along lines discussed above, in a power compensation mode, the mode controller 922 may vary the field weakening point reference responsive to a power measurement (e.g., power factor, VARs or the like). The scalar controller 920 also includes a DC bus controller 926, which provides a frequency adjustment signal to the inverter controller 924 responsive to a DC bus reference provided by the mode controller 910. The frequency adjustment causes the inverter to advance or retard its output voltage phase, thus causing the voltage of the DC bus connected to the inverter to increase or decrease. When operating in the power compensator mode, the mode controller 910 may provide a DC bus reference that increases the voltage of the DC bus, thus reducing or preventing overmodulation when the inverter is being used for power factor compensation or similar purposes.

Figure 10:
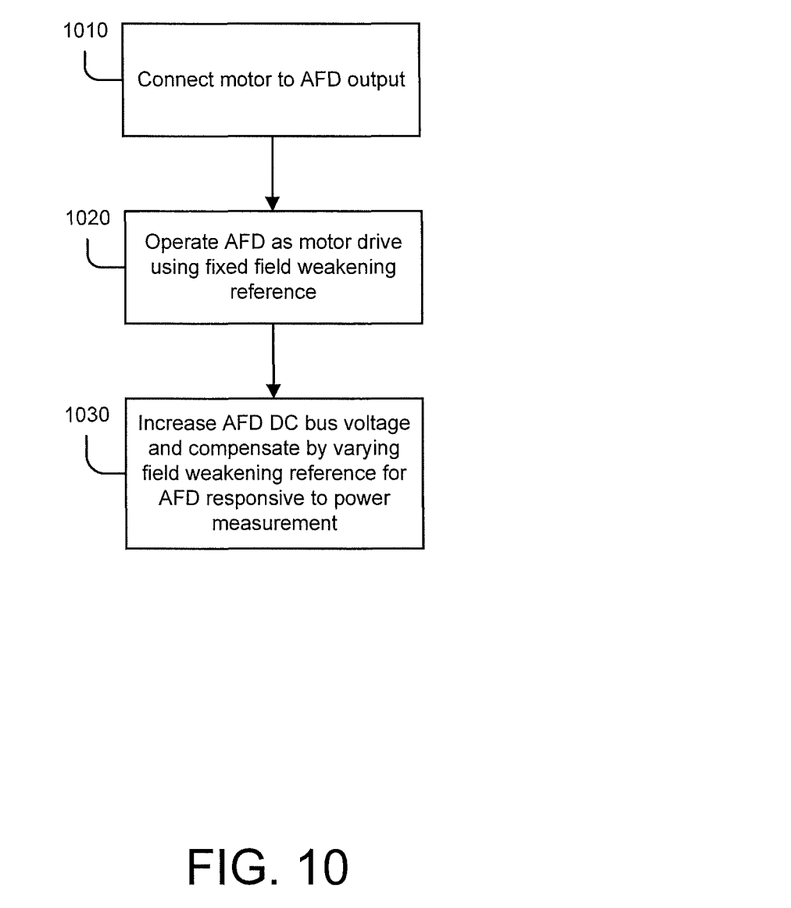
FIG. 10 is a flowchart illustrating operations using variable field weakening point and DC bus voltage control for an AFD to implement power factor compensation according to further embodiments.

FIG. 10 illustrates exemplary operations along these lines according to further embodiments. A motor is connected to an AFD output and the AFD is operated as a motor drive using a fixed field weakening reference specific to the motor(s) being driven (blocks 1010, 1020). After the motor is up to speed, synchronized to the AC line and then directly connected to the AC line, the AFD is operated as a power compensator using a varying field weakening reference and an increased DC bus voltage (block 1030).

Figure 11:
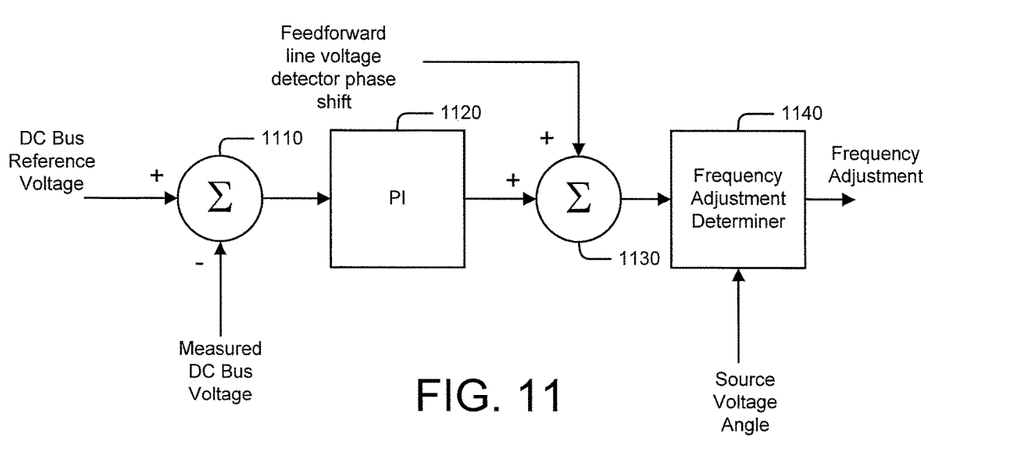
FIG. 11 is a schematic diagram illustrating a control architecture for controlling a DC bus voltage in an AFD to support power factor compensation according to some embodiments.

FIG. 11 illustrates an example of a control architecture that can generate a frequency adjustment signal to vary a voltage of a DC bus of the AFD. A DC bus voltage reference is compared to a measured DC bus voltage at a first summing junction 1110. The error signal so generated is compensated by a proportional integrator 1120, which produces an output signal that may be offset by a feedforward signal corresponding to a phase shift associated with circuitry used to measure the AC line voltage at a second summing junction 1130. This produces a signal that is applied to a frequency adjustment determiner 1140 that generates a frequency adjustment signal responsive to a measurement of the AC source voltage angle. The frequency adjustment signal adjusts a frequency of the inverter of the AFD to provide the desired DC bus voltage.

Figure 12:
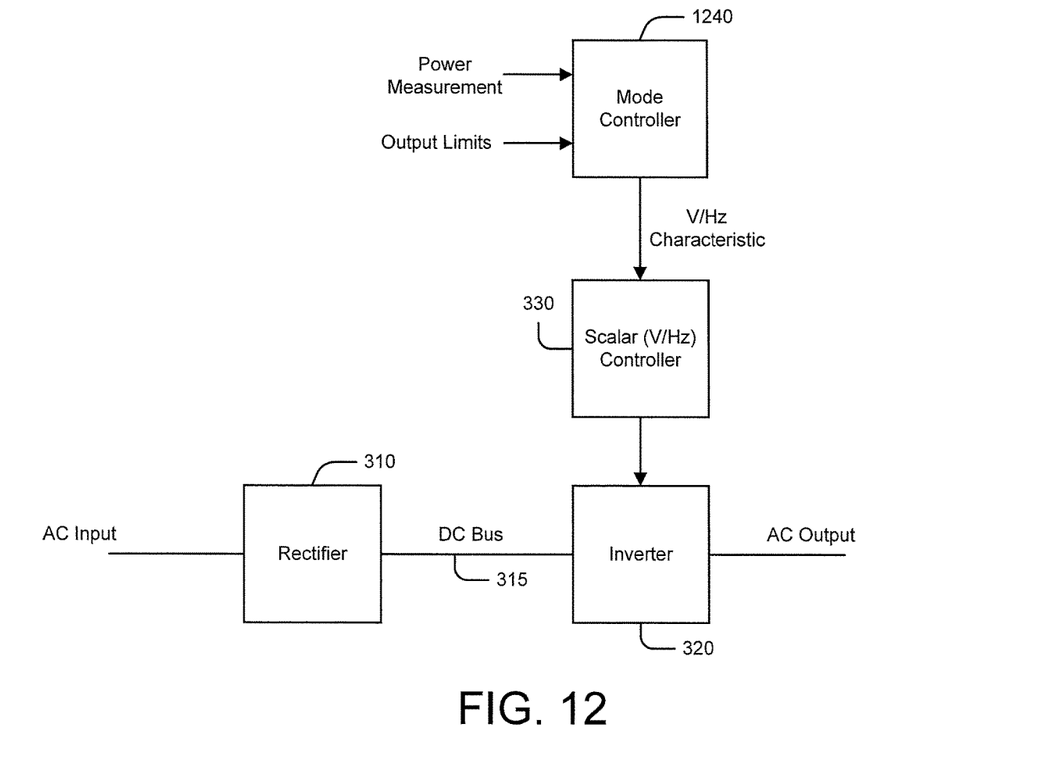
FIG. 12 is a schematic diagram illustrating power factor compensation using variable field weakening point control conditioned by output limits according to some embodiments.

According to still further aspects of the inventive subject matter, use of an AFD for power compensation may be conditioned based on output current and other limits of the AFD so that, for example, the AFD does not transition to a mode in which it folds back the output voltage and frequency and causes an overcurrent trip that disables the AFD output. Referring to FIG. 12, for example, a system may include a mode controller 1240 that provides a V/Hz characteristic (e.g., a field weakening point reference) to a scalar controller 330 of an inverter 320 of an AFD responsive to a power measurement but subject to constraints based on output limits of the AFD. Such a mode controller 1240 may employ an adaptive or perturb/observe approach to adjust a field weakening point or other V/Hz characteristic. Power factor correction may be enabled in a rules based approach where both the measured power factor and the AFD output current are tested in a cyclic loop to determine whether the field weakening point reference should be increased or decreased. The loop could initiate and test to see if the AFD is near or sliding quickly toward a current limit with a difference amplitude and rate of change fuzzy logic controller, where the other active component of the fuzzy logic controller would be the improvement or worsening of the actual PF. In some embodiments, a perturb and observe type controller could evaluate the power factor and how much current is available without going into an overcurrent condition and responsively increase or decrease the field weakening point reference. In either of these rules based controllers, the power factor control could be disabled in the event its operation increases the likelihood of an undesirable condition that may cause activation of the overcurrent protective circuitry, and then restarted once the condition passes.

Figure 13:
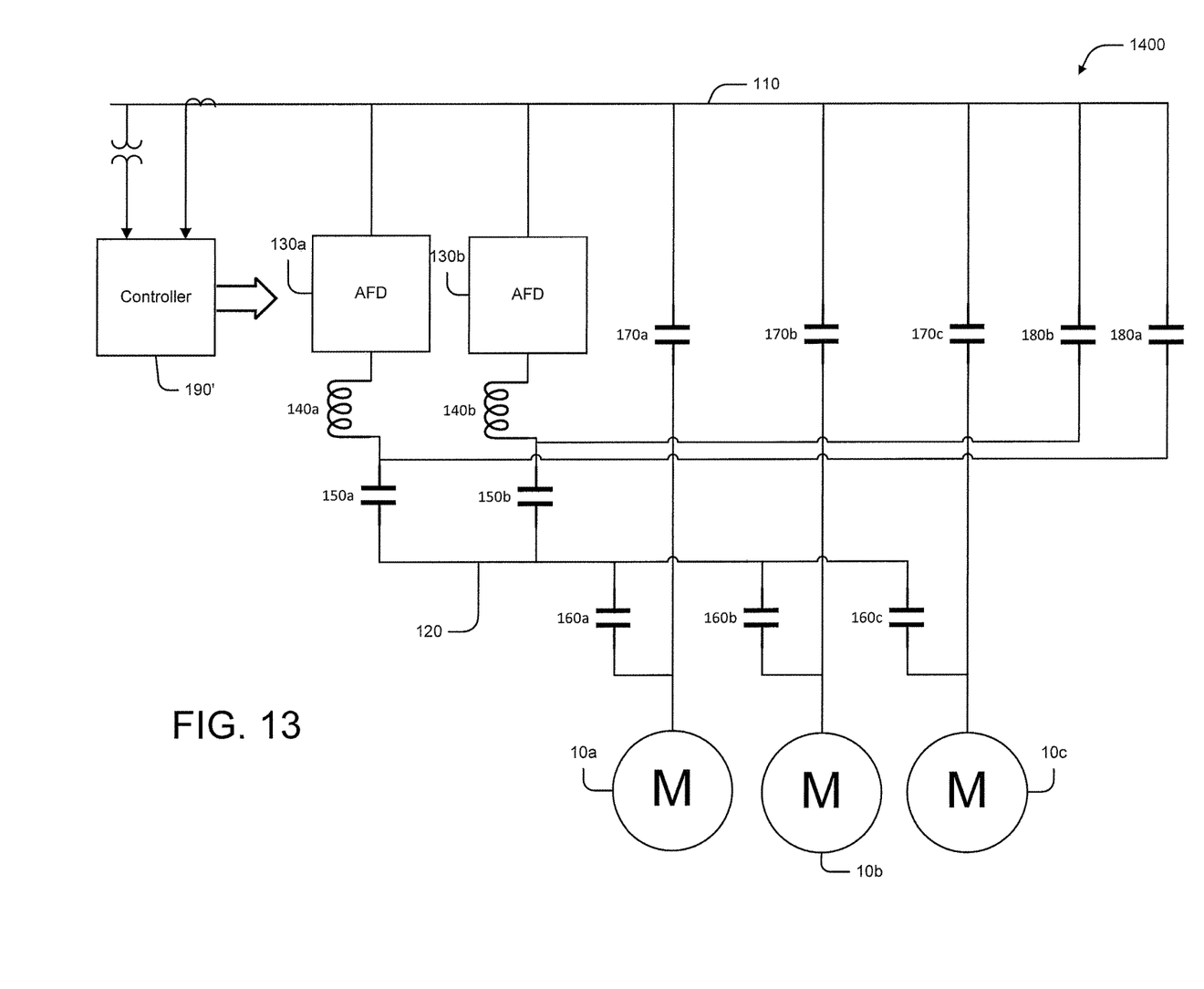
FIG. 13 is a schematic diagram illustrating a motor drive system with a redundant AFD according to some embodiments.

According to further embodiments, power factor compensation along the lines described above may be implemented using a redundant AFD. In some applications requiring high availability, a redundant AFD may be provided as a backup in case a primary AFD fails or requires maintenance. As shown in FIG. 13, first and second AFDs 130*a*, 130*b* configured to be coupled to an input bus 110 may drive motors 10*a*, 10*b*, 10*c* via respective output reactors 140*a*, 140*b*, and output contactors 150*a*, 150*b*. A controller 190' may be configured to operate a first one of the AFDs' 130*a*, 130*b* as a primary motor drive and a second one of the AFDs 130*a*, 130*b* as a backup motor drive. According to some embodiments, supplementary bypass switches 180*a*, 180*b* are configured to connect an input bus 110 directly to respective ones of the reactors 140*a*, 140*b* to support the controller 190' operating one or both of the first and second AFDs 130*a*, 130*b* as a power compensator along the lines described above. For example, if a first AFD 130*a* is the primary drive for starting and stopping of the motors 10*a*, 10*b*, 10*c*, the second AFD 130*b* may be used to provide power compensation (e.g., power factor correction).

Figure 14:
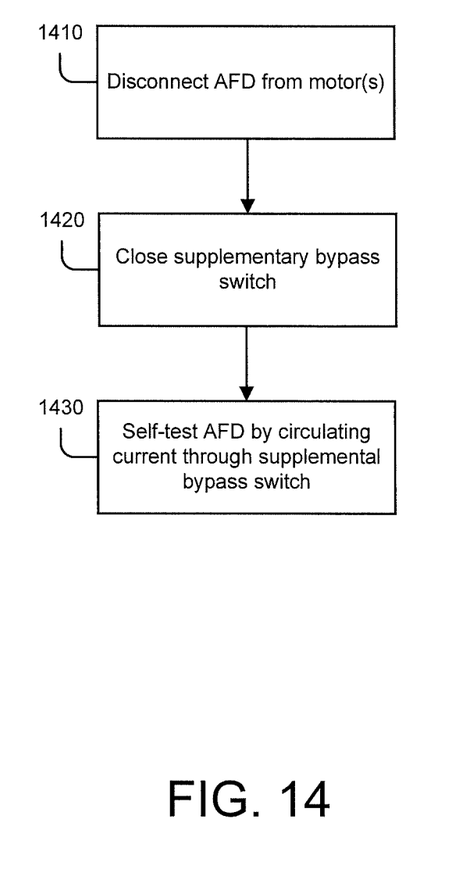
FIG. 14 is a flowchart illustrating self-test operations of the system of FIG. 1 according to further embodiments.

According to still further embodiments of the inventive subject matter, an AFD with control circuitry capable of providing the power compensation described above may also be used to implement a self-test feature. FIG. 14 illustrates an example of operations according to such embodiments. An AFD is disconnected from one or more motors (block 1410). A supplementary bypass switch, such as the supplementary bypass contactor 180 shown in FIG. 1, is closed (block 1420). The AFD is then operated in a self-test mode by generated a circulating current that passes from the output of the AFD, through the bypass switch and back into the input of the AFD (block 1430).

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An apparatus comprising:
   an adjustable frequency drive (AFD) having a first port configured to be coupled to an AC line; and
   a switching circuit configured to couple a second port of the AFD to a motor in a first mode and to couple the motor and the second port of the AFD to the AC line in a second mode, wherein the AFD is configured to operate as a motor drive to accelerate the motor to a desired speed in the first mode, wherein the switching circuit is configured to connect the motor to the AC line to bypass the AFD after the motor has been accelerated, and wherein the AFD is further configured to operate as a reactive power compensator in the second mode after connecting the motor to the AC line to bypass the AFD.

2. The apparatus of claim 1:
   wherein the switching circuit comprises:
   a first switch configured to couple the second port of the AFD to the motor; and
   a second switch configured to couple the second port of the AFD to the AC line; and
   wherein the apparatus further comprises a control circuit configured to maintain the first switch in a closed state and the second switch in an open state in the first mode and to open the first switch and maintain the second switch in a closed state in the second mode.

3. The apparatus of claim 2, wherein the switching circuit further comprises a third switch configured to connect the AC line to the motor to bypass the AFD and wherein the control circuit is configured to maintain the third switch in an open state when the AFD is operating in the first mode and to maintain the third switch in a closed state when the AFD is operating in the second mode.

4. The apparatus of claim 1:
   wherein the switching circuit comprises:
   a plurality of first switches, respective ones of which are configured to couple the second port of the AFD to respective motors; and
   a second switch configured to couple the second port of the AFD to the AC line; and
   wherein the apparatus further comprises a control circuit configured to maintain the plurality of first switches in a closed state and the second switch in an open state when the AFD is operating in the first mode and to maintain the second switch in a closed state when the AFD is operating in the second mode.

5. The apparatus of claim 4, wherein the switching circuit further comprises a plurality of third switches, respective ones of which are configured to connect the AC line to respective ones of the motors to bypass the AFD and wherein the control circuit is configured to maintain at least one the plurality third switches in a closed state when the AFD is operating in the second mode.

6. The apparatus of claim 1:
   wherein the switching circuit comprises:
   a first plurality of switches, respective ones of which are configured to couple the second port of the AFD to respective motors;
   a second plurality of switches, respective ones of which are configured to connect the AC line to respective ones of the motors to bypass the AFD; and
   wherein the apparatus further comprises a control circuit configured to maintain at least one switch of the first plurality of switches in a closed state and at least one of the second plurality of switches in a closed state when the AFD is operating in the second mode.

7. The apparatus of claim 1, wherein the AFD comprises a control circuit configured to apply a scalar control in both of the first and second modes.

8. The apparatus of claim 7, wherein the AFD comprises a control circuit configured to control a voltage at the second port based on a field weakening point reference and to vary the field weakening point reference in the second mode.

9. The apparatus of claim 8, wherein the control circuit is configured to vary the field weakening point reference in the second mode responsive to a power measurement for the AC line.

10. The apparatus of claim 8, wherein the control circuit is configured to trigger an output limitation response based on a state of the AFD meeting a criterion, and wherein the control circuit is configured to vary the field weakening set point based on the criterion.

11. The apparatus of claim 7, wherein the AFD comprises:
a DC bus;
a rectifier coupled between the first port of the AHD and the DC bus; and
an inverter coupled between the DC bus and the second port of the AFD,
wherein the control circuit is configured to maintain a first voltage level on the DC bus in the first mode and to maintain a second voltage level on the DC bus in the second mode.

12. The apparatus of claim 11, wherein the control circuit is configured to adjust a frequency of the inverter to generate the second voltage level in the second mode.

13. The apparatus of claim 1, wherein the switching circuit is configured to connect the second port of the AFD to the AC line in a third mode and wherein the AFD is configured to perform a self-test in the third mode.

14. An apparatus comprising:
an inverter configured to be selectively coupled to a motor in a first mode and to an AC line in a second mode; and
a control circuit configured to operate the inverter as a motor drive in the first mode and as a reactive power compensator in the second mode, wherein the control circuit comprises a scalar controller configured to control the inverter according to a voltage vs. frequency characteristic determined by a field weakening point reference and wherein the control circuit varies the field weakening point reference in the second mode.

15. The apparatus of claim 14, wherein the power compensator provides power factor correction.

16. The apparatus of claim 14, wherein the inverter has an input coupled to a DC bus and wherein the control circuit is configured to adjust a frequency of the inverter in the second mode to increase a voltage on the DC bus.

17. A method comprising:
coupling an output of an AFD to a motor and operating the AFD as a motor drive in a first mode; and
coupling the output of the AFD to an AC line and operating the AFD as a reactive power compensator in a second mode,
wherein operating the AFD as the motor drive comprises:
accelerating the motor to a desired speed;
synchronizing an output of the AFD to a voltage on an AC line; and
connecting the motor to the AC line via a bypass switch that bypasses the AFD; and
wherein operating the AFD as the reactive power compensator comprises operating the AFD as a power compensator after connecting the motor to the AC line via the bypass switch.

18. The method of claim 17:
wherein accelerating the motor comprises increasing a voltage and a frequency applied to the motor according using a scalar controller with a fixed field weakening reference point; and
wherein operating the AFD as the reactive power compensator comprises using the scalar controller with a field weakening reference point that varies responsive to a power measurement.

* * * * *

UNITED STATES PATENT AND TRADEMARK OFFICE
CERTIFICATE OF CORRECTION

PATENT NO. : 11,300,632 B2
APPLICATION NO. : 16/223865
DATED : April 12, 2022
INVENTOR(S) : Maurin, Jr. et al.

Page 1 of 1

It is certified that error appears in the above-identified patent and that said Letters Patent is hereby corrected as shown below:

In the Claims

Column 11, Claim 11, Line 21: Please correct "port of the AHO"
to read – port of the AFD –

Column 12, Claim 19, Line 15: Please correct "output of an AFD to a motor"
to read – output of an AFD to the motor –
Claim 19, Line 16: Please correct "operating the AFD as a motor drive"
to read – operating the AFD as the motor drive –

Signed and Sealed this
Twenty-sixth Day of July, 2022

Katherine Kelly Vidal
*Director of the United States Patent and Trademark Office*